(12) United States Patent
Steele et al.

(10) Patent No.: US 10,059,471 B2
(45) Date of Patent: Aug. 28, 2018

(54) METHOD FOR RELEASING A DEPLOYABLE BOOM

(71) Applicant: SolAero Technologies Corp., Albuquerque, NM (US)

(72) Inventors: Kenneth Loyd Steele, Carlsbad, CA (US); Theodore Garry Stern, El Cajon, CA (US)

(73) Assignee: SolAero Technologies Corp., Albuquerque, NM (US)

( * ) Notice: Subject to any disclaimer, the term of this patent is extended or adjusted under 35 U.S.C. 154(b) by 0 days.

(21) Appl. No.: 15/638,063

(22) Filed: Jun. 29, 2017

(65) Prior Publication Data

US 2017/0297749 A1    Oct. 19, 2017

Related U.S. Application Data

(63) Continuation-in-part of application No. 15/001,962, filed on Jan. 20, 2016, now abandoned, which is a
(Continued)

(51) Int. Cl.
*B64G 1/44* (2006.01)
*B64G 1/22* (2006.01)
(Continued)

(52) U.S. Cl.
CPC ............. *B64G 1/443* (2013.01); *B64G 1/222* (2013.01); *H01L 31/042* (2013.01)

(58) Field of Classification Search
CPC .......... B64G 1/442; B64G 1/222; B64G 1/44; B64G 1/443; H01L 31/041; H02S 30/20;
(Continued)

(56) References Cited

U.S. PATENT DOCUMENTS 3,145,948 A    8/1964  Kershner
3,473,758 A   10/1969  Valentijn
(Continued)

FOREIGN PATENT DOCUMENTS

EP    2354006 A1    8/2011
EP    2471714 A1    7/2012

OTHER PUBLICATIONS

Clark, Craig, *Huge Power Demand . . . Itsy-Bitsy Satellite, Solving the CubeSat Power Paradox* in 24th Annual AIAA/USU Conference on Small Satellites (2010), obtained online from http://digitalcommons.usu.edu/cgi/viewcontent.cgi?article=1202 &context=smallsat (last accessed on Sep. 30, 2016).
(Continued)

*Primary Examiner* — Theodore V Adamos

(57) ABSTRACT

The present disclosure describes a method of deploying an extensible boom from a housing. Sheets supporting respective arrays of photovoltaic devices are deployed substantially simultaneously so that a first sheet is deployed in a first direction from the housing and a second sheet is deployed in an opposite direction from the housing. Angular momentum imparted by deploying the first sheet is canceled by angular momentum imparted by deploying the second sheet. The housing can be part of a space satellite, such that the first and second sheets are deployed without causing the satellite to move out of its orbit.

15 Claims, 4 Drawing Sheets

Related U.S. Application Data continuation-in-part of application No. 14/921,238, filed on Oct. 23, 2015, now Pat. No. 9,919,815.

(60) Provisional application No. 62/068,501, filed on Oct. 24, 2014.

(51) Int. Cl.
*H01L 31/041* (2014.01)
*H01L 31/042* (2014.01)

(58) Field of Classification Search
CPC ....... H02S 40/42; H02S 40/22; B65H 75/364; Y10S 136/292; Y02E 10/52
USPC ............ 244/159.5, 172.6, 172.7, FOR. 112; 136/244, 245, 292
See application file for complete search history.

(56) References Cited

U.S. PATENT DOCUMENTS

| | | |
|---|---|---|
| 3,490,950 A | 1/1970 | Myer |
| 3,690,080 A | 9/1972 | Dillard |
| 3,733,758 A | 5/1973 | Maier et al. |
| 3,735,943 A | 5/1973 | Fayet |
| 3,778,312 A | 12/1973 | Karius |
| 3,785,590 A | 1/1974 | Wentworth |
| 4,282,394 A | 8/1981 | Lackey et al. |
| 4,313,422 A | 2/1982 | McEntee |
| 4,587,777 A | 5/1986 | Brown et al. |
| 4,635,071 A | 1/1987 | Gounder et al. |
| 4,636,579 A | 1/1987 | Hanak et al. |
| 4,713,492 A | 12/1987 | Hanak |
| 4,727,932 A | 3/1988 | Mahefkey |
| 4,968,372 A | 11/1990 | Maass |
| 5,131,955 A | 7/1992 | Stern et al. |
| 5,296,044 A | 3/1994 | Harvey et al. |
| 5,487,791 A | 1/1996 | Everman |
| 5,567,500 A | 10/1996 | Marshall et al. |
| 5,647,916 A | 7/1997 | Guazzoni |
| 5,789,060 A | 8/1998 | Marshall et al. |
| 5,865,905 A | 2/1999 | Clemens |
| 5,885,367 A | 3/1999 | Brown et al. |
| 6,008,447 A | 12/1999 | Meurer et al. |
| 6,137,454 A | 10/2000 | Peck |
| 6,147,294 A | 11/2000 | Dailey |
| 6,310,281 B1 | 10/2001 | Wendt |
| 6,505,795 B1 | 1/2003 | Thompson et al. |
| 6,547,190 B1 | 4/2003 | Thompson et al. |
| 6,637,702 B1 | 10/2003 | McCandless |
| 6,702,976 B2 | 3/2004 | Sokolowski |
| 6,772,479 B2 | 8/2004 | Hinkley et al. |
| 6,904,722 B2 | 6/2005 | Brown et al. |
| 6,920,722 B2 | 7/2005 | Brown et al. |
| 7,211,722 B1 | 5/2007 | Murphy |
| 7,354,033 B1 | 4/2008 | Murphey |
| 7,708,228 B2 | 5/2010 | Chaix et al. |
| 7,710,348 B2 | 5/2010 | Taylor |
| 7,806,370 B2 | 10/2010 | Beidleman et al. |
| 7,895,795 B1 | 3/2011 | Murphey et al. |
| 8,061,660 B2 | 11/2011 | Beidleman et al. |
| 8,066,227 B2 | 11/2011 | Keller et al. |
| 8,109,472 B1 | 2/2012 | Keller et al. |
| 8,376,282 B2 | 2/2013 | Keller et al. |
| 8,387,921 B2 | 3/2013 | Taylor et al. |
| 8,393,581 B2 | 3/2013 | Keller et al. |
| 8,616,502 B1 | 12/2013 | Stribling et al. |
| 8,636,253 B1 | 1/2014 | Spence et al. |
| 8,683,755 B1 | 4/2014 | Spence et al. |
| 8,757,553 B2 | 6/2014 | Legrand et al. |
| 8,757,554 B1 | 6/2014 | Harvey |
| 8,770,522 B1 | 7/2014 | Murphey et al. |
| 8,816,187 B1 | 8/2014 | Stribling |
| 8,893,442 B1 | 11/2014 | Spence et al. |
| 8,894,017 B1 | 11/2014 | Baghdasarian |
| 8,915,474 B1 | 12/2014 | Baghdasarian et al. |
| 9,004,410 B1 | 4/2015 | Steele et al. |
| 9,079,673 B1 | 7/2015 | Steele |
| 9,120,583 B1 | 9/2015 | Spence |
| 9,156,568 B1 | 10/2015 | Spence et al. |
| 2002/0040726 A1 | 4/2002 | Roth et al. |
| 2002/0112417 A1 | 8/2002 | Brown et al. |
| 2003/0000569 A1 | 1/2003 | Zwanenburg |
| 2003/0047206 A1 | 3/2003 | Kawam |
| 2003/0057329 A1 | 3/2003 | Thompson et al. |
| 2003/0164186 A1 | 9/2003 | Clark |
| 2004/0016454 A1 | 1/2004 | Murphy et al. |
| 2004/0194397 A1 | 10/2004 | Brown et al. |
| 2005/0178921 A1 | 8/2005 | Stribling et al. |
| 2006/0174930 A1 | 8/2006 | Murphy et al. |
| 2007/0017566 A1 | 1/2007 | Gaudiana et al. |
| 2007/0262204 A1 | 11/2007 | Beidleman et al. |
| 2009/0078306 A1 | 3/2009 | Nagengast et al. |
| 2009/0126775 A1 | 5/2009 | White et al. |
| 2009/0184207 A1 | 7/2009 | Warren et al. |
| 2010/0163684 A1 | 7/2010 | Dando |
| 2010/0319270 A1 | 12/2010 | Slade |
| 2011/0162690 A1 | 7/2011 | Workman et al. |
| 2011/0192444 A1 | 8/2011 | Beidleman et al. |
| 2011/0204186 A1 | 8/2011 | Keller et al. |
| 2011/0210209 A1 | 9/2011 | Taylor |
| 2011/0226897 A1 | 9/2011 | Padavano |
| 2011/0253614 A1 | 10/2011 | Curran et al. |
| 2012/0012154 A1 | 1/2012 | Keller |
| 2012/0025750 A1 | 2/2012 | Margo |
| 2012/0090660 A1 | 4/2012 | Keller et al. |
| 2012/0156824 A1 | 6/2012 | Streett |
| 2012/0167943 A1* | 7/2012 | Blanchard ............ B64G 1/222 136/245 |
| 2012/0167944 A1 | 7/2012 | Blanchard et al. |
| 2013/0061541 A1 | 3/2013 | Taylor et al. |
| 2013/0112233 A1 | 5/2013 | Coakley |
| 2013/0186011 A1 | 7/2013 | Keller et al. |
| 2013/0193303 A1 | 8/2013 | Smith |
| 2013/0276875 A1 | 10/2013 | Carpenter |
| 2014/0042275 A1 | 2/2014 | Abrams et al. |
| 2014/0123575 A1 | 5/2014 | Bobbio |
| 2014/0150863 A1 | 6/2014 | Spence et al. |
| 2014/0151485 A1 | 6/2014 | Baudasse et al. |
| 2014/0230949 A1 | 8/2014 | Daton-Lovett |
| 2014/0263844 A1 | 9/2014 | Cook, Jr. |
| 2014/0326833 A1 | 11/2014 | Spence et al. |
| 2015/0145724 A1 | 5/2015 | Kana et al. |
| 2015/0162656 A1 | 6/2015 | Fitz-Coy et al. |
| 2016/0024790 A1 | 1/2016 | Baudasse |

OTHER PUBLICATIONS

Costantine, et al. *CubeSat Deployable Antenna Using Bistable Composite Tape-Springs* IEEE Antennas and Wireless Propagation Letters 11:285-288 (2012).

EP Extended Search Report for EP Application No. 15167692.1-1754, dated Nov. 3, 2015 (6 pages).

EP Search Report and Opinion for European Patent Application No. 16194201.6, dated Mar. 30, 2017 (9 pages).

Yee, et al., *Carbon Fibre Reinforced Plastic Tape Springs*. 45th AIAA/ASME/ASCE/AHS/ASC Structures, Structural Dynamics & Materials Conference 2004-1819.

\* cited by examiner

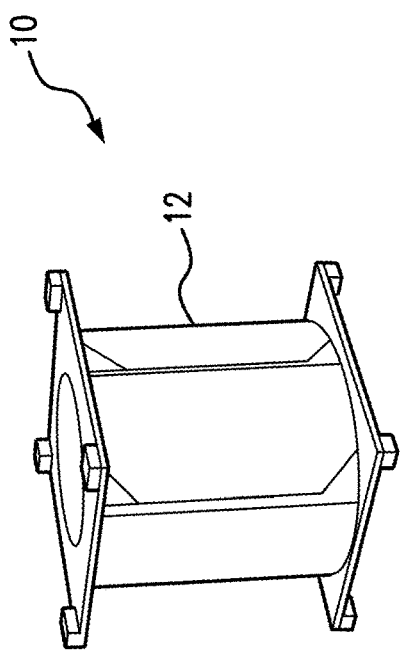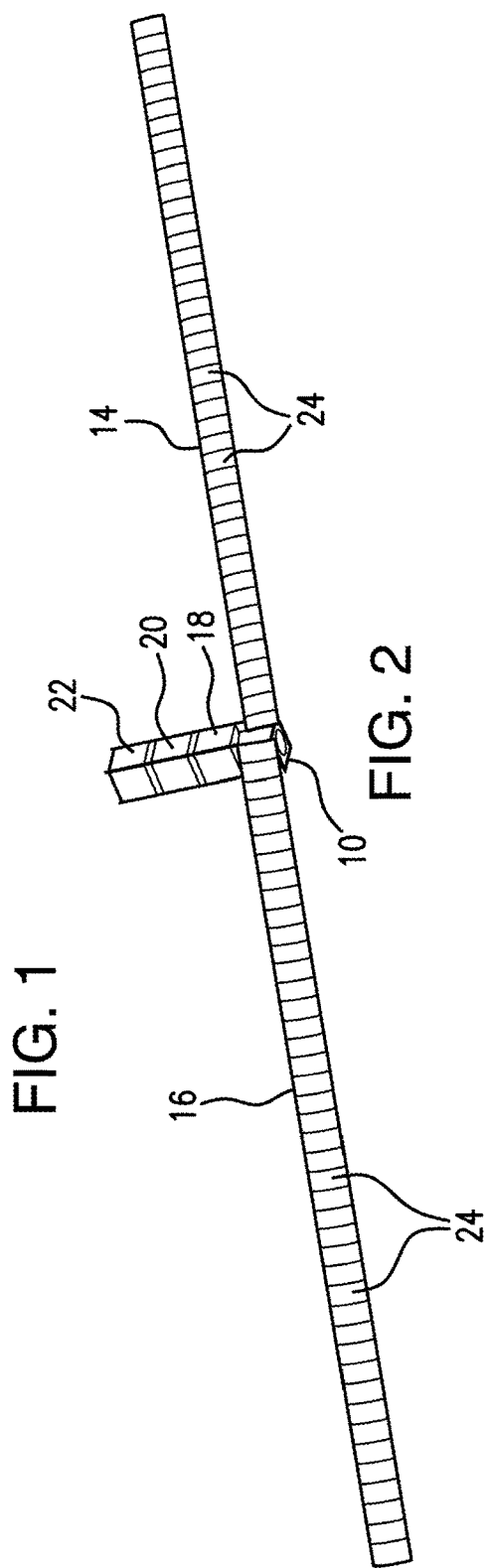

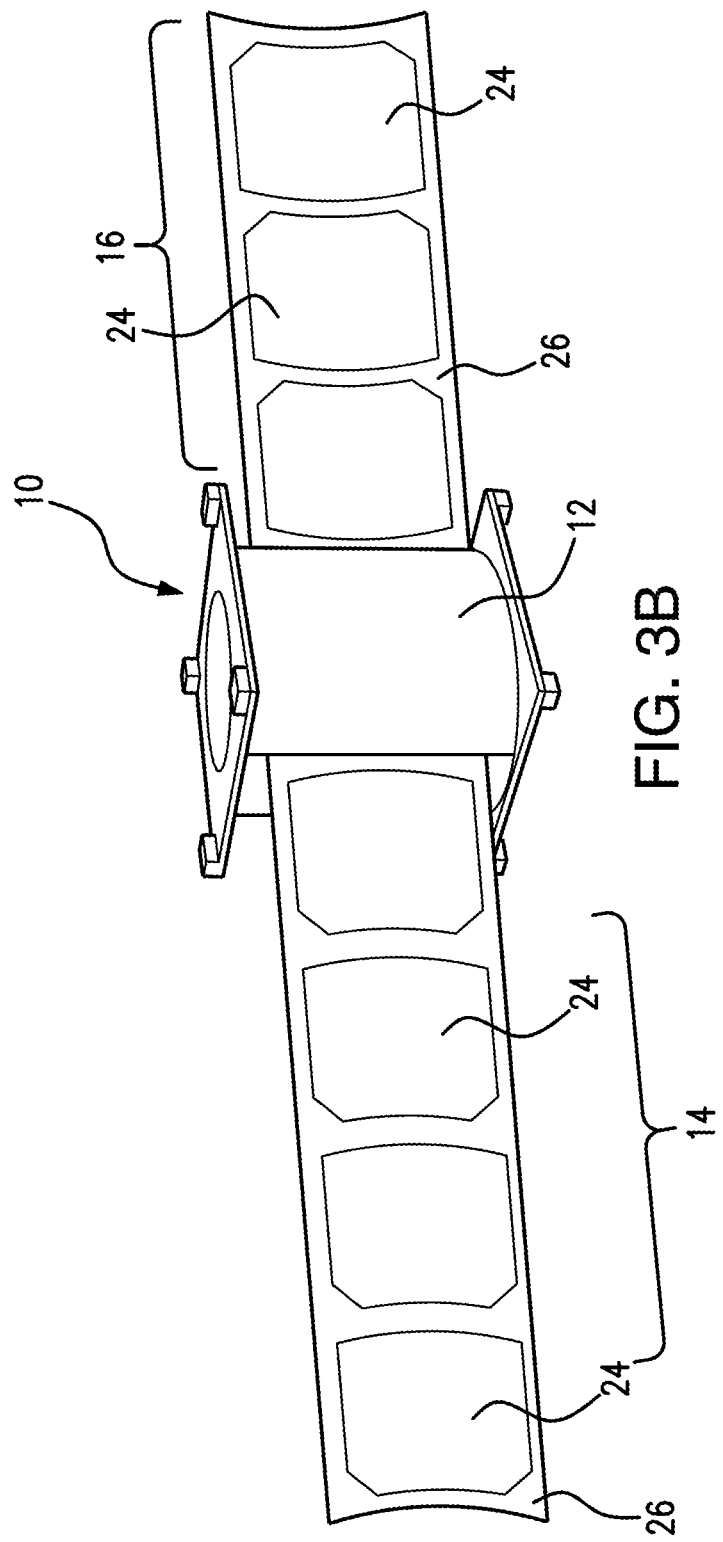

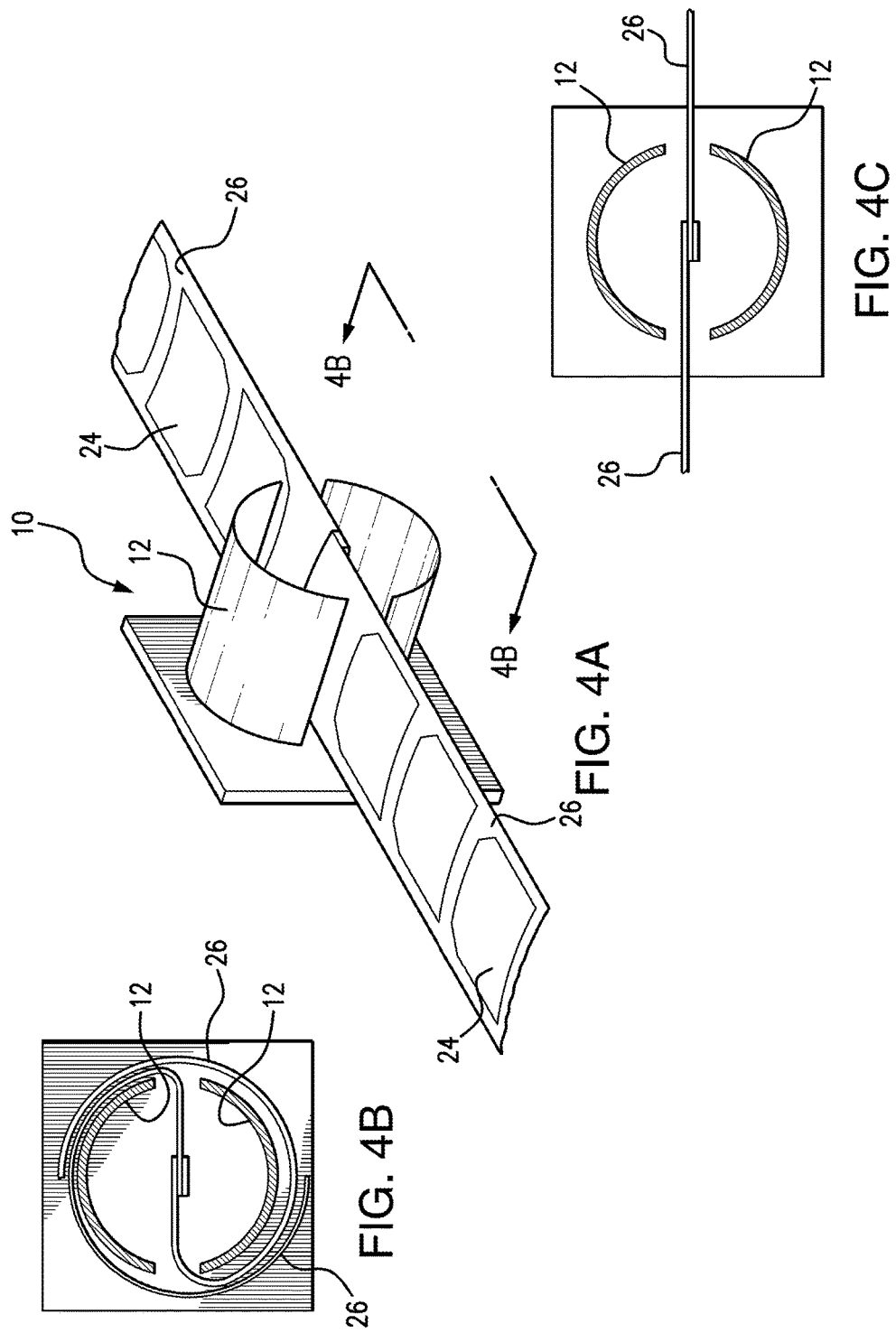

METHOD FOR RELEASING A DEPLOYABLE BOOM

REFERENCE TO RELATED APPLICATIONS

This application is a continuation-in-part of U.S. patent application Ser. No. 15/001,962, filed Jan. 20, 2016, which is a continuation-in-part of U.S. patent application Ser. No. 14/921,238, filed Oct. 23, 2015, which claims the benefit of U.S. Provisional Application No. 62/068,501 filed Oct. 24, 2014. The disclosures of the earlier applications are incorporated herein by reference in their entirety.

This application is related to U.S. patent application Ser. No. 14/546,958, filed Nov. 18, 2014, now U.S. Pat. No. 9,004,410; and U.S. patent application Ser. No. 14/658,043, filed Mar. 13, 2015 now U.S. Pat. No. 9,079,673.

BACKGROUND OF THE DISCLOSURE

1. Field of the Disclosure

The present disclosure relates to deployable booms associated with vehicles or permanent structures, the booms being structured components, or assemblies including, in some embodiments, transducers for collecting or emitting electromagnetic energy.

2. Description of the Related Art

Solar photovoltaic arrays are commonly used to power spacecraft. Spacecraft needing high power generation typically use solar array wings that fold or roll-up for launch (because of the constraints of available volume within the launch vehicle), then unfold or unroll in space to present a large solar collection area as-needed to intercept sufficient sunlight to generate the required power. A common approach is to mount the solar cells onto rigid panels, accordion-fold the panels for stowage, and subsequently deploy them in space using hinges between the panels and a supplied deployment force. The common approach has limitations in how compactly the arrays can be packaged, because of the inherent volume and inflexibility of the rigid panels that are used as mounting substrates for the photovoltaic assemblies.

To overcome the packaging limitations of rigid panels, reduce mass, and reduce packaged volume, a Solar Cell Blanket is often used. A Solar Cell Blanket may comprise a thin, flexible assembly of solar cells, coverglass, interconnects, terminal strips, and insulating film that may be unsupported, instead of mounted on thick rigid panel structures. These thin flexible membranes are normally supplemented with a separate deployable super-structure or scaffold that provides the means to deploy the folded or rolled-up solar array into its final deployed configuration and to provide the structural rigidity to hold the deployed array, since the flexible membrane is not a rigid structure. The deployed super-structure is typically attached to an orientation device on a spacecraft so as to allow the solar array to be pointed towards the sun. The super-structure also allows the array to withstand the structural loads that may be placed on the deployed array during spacecraft operations, including loads from accelerations that occur during the spacecraft's operating life, including orbital and orientation maneuvers.

Prior methods to provide the super-structure for a flexible membrane deployable solar array typically use umbrella-like, or oriental-fan-like structures to deploy and maintain the structure of a circular solar array, or one or two deployable booms to deploy a rolled or folded rectangular array. The solar arrays found on the Space Station and on the Hubble telescope are examples of rectangular arrays that use a single deployable boom or a pair of deployable booms, respectively, to deploy a flexible solar array and provide deployed structural rigidity. Such flexible membrane solar arrays with discrete and separate super-structures are limited in the shielding provided to the backside of the solar array after deployment, and by the complexity of deploying such an array with tensioning interfaces between the deployable boom and the nonstructural solar array blanket.

CubeSats are a type of miniaturized satellites. Although there is a desire to provide power for CubeSats from solar panels, the known methods of providing solar arrays described above are difficult or impossible to apply to CubeSats because of the small size of the CubeSat and the limited space available on the CubeSat. Accordingly, there is a need for an improved system that overcomes these and other limitations.

An additional problem relates to keeping a satellite in a particular orbit. Various forces may interfere with the satellite and can cause a satellite's orbit to change in an unintended manner. For example, deploying an extensible boom from a satellite housing may impart a net change in angular momentum to the satellite (e.g., a CubeSat), which in turn can cause the satellite to move out of its intended orbit. This problem, particularly in the context of booms that include transducers for collecting or emitting electromagnetic energy, has not been adequately addressed by prior techniques.

SUMMARY

Briefly, and in general terms, the present disclosure describes a method of deploying an extensible boom from a housing comprising:

providing a support including an array of transducer devices;

mounting the support on a first flexible, elongated, rectangular sheet in a housing, the sheet composed of a composite laminate having a predetermined pattern of graphite fiber plies which impart a predefined tension in the planar surface of the sheet so that it curls into a curvilinear sheet having a uniform radius of curvature along its major axis;

supporting the sheet on a spool in the housing under compression in a stowed configuration; and releasing the spool so that the sheet unwinds automatically and is deployed from the housing in a linear direction.

In some embodiments, the array of transducer devices is selected from groups of (i) an array of photovoltaic devices; (ii) an array of semiconductor sensors; (iii) an antenna array; and/or (iv) thermal transfer elements.

In some embodiments, the transducers are mounted on a polyimide carrier and the polyimide carrier is bonded to the composite laminate.

In some embodiments, the flexible sheet has a thickness of between 0.1 mm and 0.5 mm, a width of less than 10 cm, and a length of between 10 and 200 cm after full deployment.

In some embodiments, the array of transducer devices include a first transducer module having a first side dimension, and a second transducer module having a second side dimension different from the first side dimension.

In some embodiments, each transducer module includes a plurality of discrete photovoltaic solar cells connected in an electrical serial or parallel configuration.

In some embodiments, the array of photovoltaic solar cell devices includes an array of coverglass-interconnected-solar cells (CICs) mounted on the polyimide carrier by a pressure sensitive adhesive.

In some embodiments, the pattern of graphite fiber plies is pre-impregnated with resin and consist of at least intermediate modulus graphite fiber reinforced plies to impart substantially uniform strength, stiffness, and flexibility.

In some embodiments, the graphite fiber plies gives the sheet a strength of up to 2.0 g and a stiffness resulting in a natural frequency greater than 0.01 Hz.

In some embodiments, the sheet is circumferentially wound to form a spool configuration in a stowed configuration, and forms into a cylindrical portion sheet having a uniform cross-sectional curvature as it unwinds from the spool configuration upon deployment to the deployed configuration.

In some embodiments, the sheet is stored within a one unit CubeSat housing for a space vehicle in its stowed configuration.

In some embodiments, the method further comprises:
providing a second flexible, elongated, substantially rectangular sheet for supporting a plurality of transducer assemblies;
supporting the second rectangular sheet in a spooled configuration under compression on a mandrel in a stationary position in a stowed configuration; and
releasing the second sheet from the spooled configuration by releasing the mandrel to allow it to rotate during a deployment operation so that the sheet automatically deploys from the mandrel and curls into a curvilinear sheet having a uniform radius of curvature along its major axis and extending substantially linearly away from the housing.

In some embodiments, the first and second sheets are deployed substantially simultaneously so that the first sheet is deployed in a first direction from the housing and the second sheet is deployed in an opposite direction from the housing. By using such an arrangement, which is described in greater detail below, the angular momentum imparted by deploying the first sheet can be canceled by the angular momentum imparted by deploying the second sheet, and vice-versa. The result is that the net momentum imparted to the space vehicle (e.g., a CubeSat or other satellite) as a result of deploying the sheets is substantially zero, such that the space vehicle remains in its orbit. Thus, multiple sheets supporting transducer assemblies can be deployed without causing the satellite to move out of its orbit.

In some embodiments, the housing is disposed in a spacecraft, and the spacecraft is composed of CubeSat modules, wherein the first and second rectangular sheets are stowed within a one unit CubeSat housing.

In some embodiments, the housing is disposed in a vehicle.

In some embodiments, the housing is disposed within a terrestrial structure.

In some embodiments, the radius of the curvature of the sheet is such that the sheet has a depth of not less than 5% nor greater than 20% of the width of the sheet.

In some embodiments, the lenticular shape of the sheet is flattened when it is mounted under compression on the spool in the stowed configuration.

In some embodiments, the housing includes an aperture through which the rectangular sheet is deployed.

In some implementations, the pattern of graphite fiber plies consists of at least intermediate modulus 7 (IM7) plies oriented at least 30° apart from each other.

In some implementations, the radius of the curvature of the sheet may be selected by those skilled in the art to meet application requirements.

In some implementations, the sheet has a width of less than 100 mm and a length after full deployment that may be selected by those skilled in the art to meet application requirements.

In another aspect, the present disclosure describes a method of deploying a boom comprising: providing a flexible, elongated, rectangular sheet for supporting the rectangular sheet in a spool under compression on a mandrel in a stowed configuration; and releasing the sheet from the mandrel during a deployment operation so that the sheet automatically deploys from the mandrel.

In another aspect, the present disclosure describes a vehicle with deployable solar array for providing less than 50 watts of power comprising: first and a second flexible, elongated, rectangular sheets for supporting a string of solar cell assemblies connected in a serial and/or parallel electrical configuration; a mandrel in the vehicle configured for supporting the first and second rectangular sheets in a stowed configuration in the vehicle in which the sheets are coiled under compressive force; and a deployment aperture on the vehicle for enabling the automatic unwinding of the sheets from the mandrel during a deployment operation.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

To complete the description and in order to provide for a better understanding of the disclosure, a set of drawings is provided. The drawings form an integral part of the description and illustrate embodiments of the disclosure, which should not be interpreted as restricting the scope of the disclosure, but just as examples of how the disclosure can be carried out. The drawings comprise the following figures:

FIG. 1 is an illustration of an exemplary CubeSat having a spool for storing one or more solar cell arrays;

FIG. 2 is an illustration of the exemplary CubeSat of FIG. 1 attached to three additional CubeSats and having the solar cell arrays in a deployed state;

FIG. 3B is an illustration of the exemplary CubeSat of FIG. 1 having the solar cell arrays in a deployed state;

FIG. 4A is another view of the exemplary CubeSat of FIG. 1 having the solar cell arrays in a deployed state;

FIG. 4B is a view through the B-B plane of FIG. 4A showing the solar cell arrays in a deployed state; and FIG. 4C is a view through the B-B plane of FIG. 4A showing the solar cell arrays in a stowed state.

DESCRIPTION OF ILLUSTRATIVE EMBODIMENTS

Figure 3A:
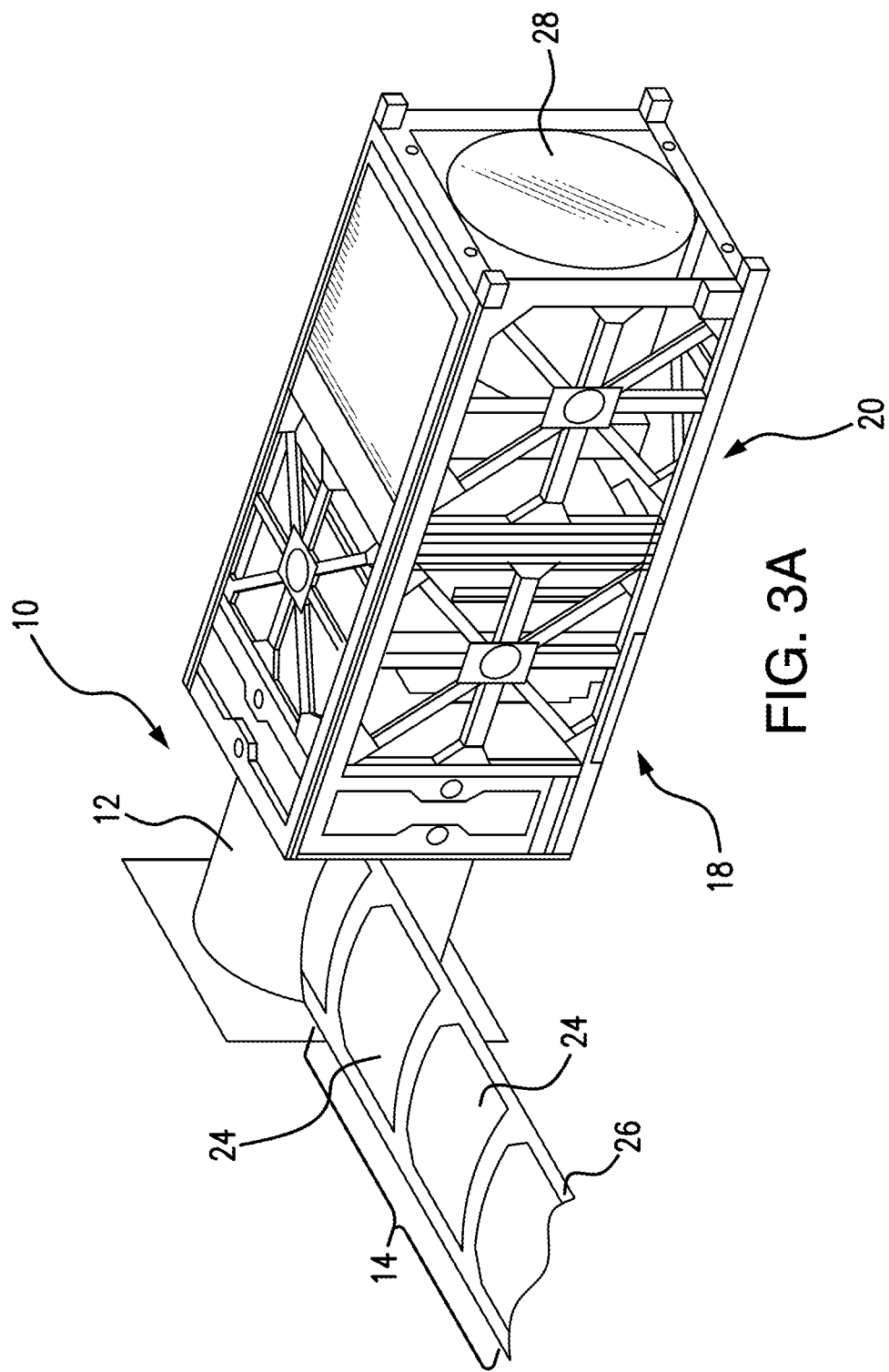
FIG. 3A is an illustration of the exemplary CubeSat of FIG. 1 attached to two additional CubeSats and having the solar cell array in a deployed state.

Details of the present invention will now be described including exemplary aspects and embodiments thereof.

Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

In the most general terms, the present disclosure relates to deployable booms associated with vehicles or permanent structures, the booms being structured components, or assemblies including, in some embodiments, transducers for collecting or emitting electromagnetic energy. One embodiment of the present disclosure depicts a space vehicle such as a satellite, in which the boom enables a compact stowed configuration of the deployable assembly during launch into space, and automatic deployment when the satellite reaches the desired orbit.

In some embodiments, the assembly may be an array of solar cells, while in other embodiments, the assembly may be other types of operational devices such as sensors, antennas, optical elements, or thermal or other types of radiative elements.

As shown with respect to FIGS. 1 and 2 a small spacecraft such as a CubeSat 10 has a mandrel (e.g., a spool) 12 for storing one or more deployable arrays 14, 16 of photovoltaic devices 24. As mentioned above, a CubeSat is a type of miniaturized satellite. A typical CubeSat is a 10 cm×10 cm×10 cm cube, thus having a volume of one liter; other dimensions are possible as well. In some cases, CubeSats can be attached to one another in strings or blocks to provide functionalities and capabilities that would not otherwise be practically available in a single CubeSat. For example, one CubeSat can be used as a power source to supply power necessary for other attached CubeSats to perform their functions.

The arrays 14, 16 can be used, for example, as a power source to supply power to one or more additional CubeSats 18, 20, 22 attached to the CubeSat 10. For example, in some implementations, each array(s) 14, 16 is suitable for providing a small amount of power (e.g., less than 50 watts). In the illustrated example, the photovoltaic devices 24 are solar cells. In some instances, each array 14, 16 of photovoltaic devices 24 includes a first module having a first side dimension, and a second module having a second side dimension different from the first side dimension. Each module can include, for example, a plurality of discrete solar cells connected in a serial or parallel configuration. In some implementations, each array 14, 16 of photovoltaic devices 24 includes an array of coverglass-interconnected-solar cells (CICs) mounted on the polyimide carrier by a pressure sensitive adhesive.

As shown in FIGS. 3A and 3B, the photovoltaic devices 24 of each array 14, 16 can be supported, for example, by a respective flexible, elongated, rectangular sheet 26 composed of a composite laminate having a predetermined pattern of graphite fiber plies which impart a predefined tension in the planar surface of the sheet so that it curls into a curvilinear sheet having a uniform radius of curvature along its major axis. For example, in some implementations, the pattern of graphite fiber plies consists of at least intermediate modulus 7 (IM7) plies oriented at least 30° apart from each other. In some instances, the graphite fiber plies give the sheet 26 a strength of up to 0.28 g, a capability of handling stress when deployed at a vibration frequency of up to 0.9 Hz, and a stability of up to 1 milli-g under deployed flight loading. In some instances, each sheet 26 has a width of less than 100 mm. The foregoing dimension may differ for other implementations.

In combination, the solar cells 24 and the flexible sheet 26 on which they are mounted form a solar cell assembly. In some cases, the solar cells 24 are mounted indirectly on the sheet 26. For example, the solar cells 24 can be mounted on a polyimide carrier, which is bonded to the composite laminate sheet 26. The flexible sheet 26 can have a thickness, for example, of between 0.1 mm and 0.3 mm. Further, the solar cell assemblies can have a side length such that when mounted on the polyimide carrier and wrapped around the spool 12 in the stowed configuration, the solar cell assemblies bend no more than a small amount out of plane. The foregoing dimensions may differ for other implementations.

In the illustrated example, the mandrel (e.g., spool) 12 for supporting the sheets 26 is disposed within a one unit CubeSat housing 30. The sheets 26 can be arranged in a deployed configuration (as shown, e.g., in FIGS. 2, 3A, 3B, 4A and 4B), or in a stowed configuration (as shown, e.g., in FIG. 4B). In the stowed configuration, the sheets 26 are coiled or wound about the spool 12 under compressive force. In particular, in the stowed configuration, each sheet 26 can be circumferentially wound to form a spool configuration in a stationary position (see FIG. 4B). Upon deployment to the deployed configuration, as each sheet 26 unwinds from the spool configuration, the sheet 26 forms into a planar cylindrical portion sheet having a uniform cross-sectional curvature. In some implementations, the substrate is adapted to store strain energy when elastically deformed, and the assembly can transition from the stowed configuration to the deployed configuration using the stored strain energy. Thus, each sheet 26 can be released from the stowed configuration (FIG. 4B) by releasing the spool 12 to allow it to rotate during a deployment operation so that the sheet automatically deploys from the spool (FIG. 4A). As the sheet 26 unwinds from the spool 12, the sheet 26 forms a substantially planar sheet having a uniform curvature. The CubeSat 10 can include one or more deployment apertures for enabling the automatic unwinding of the sheets 26 from the spool 12 during the deployment operation so that a first sheet 26 is deployed in a first direction from the CubeSat and a second sheet 26 is deployed in an opposite direction from the CubeSat. In some instances, the second sheet is deployed in the same plane as the first sheet, but in the opposite direction.

The deployment apertures can be located on opposite sides of the housing such that, as the first and second sheets 26 are unwound and deployed simultaneously away from the CubeSat in opposite directions from one another, the angular momentum imparted by deploying the first sheet is canceled by the angular momentum imparted by deploying the second sheet, and vice-versa. By deploying the sheets such that the magnitude of the angular momentum imparted during the deployment is the same for both sheets, but in opposite directions, the result is that the net momentum imparted to the CubeSat as a result of deploying the sheets is substantially zero, such that the deployment does not adversely impact the CubeSat's orbit. Thus, multiple sheets supporting transducer assemblies can be deployed without causing the CubeSat to move out of its orbit.

As mentioned above, in some instances, the CubeSat 10 is attached to one or more additional CubeSats. As shown, for example in FIG. 3A a string of three CubeSats includes the CubeSat 10 of FIG. 1 having a solar cell array 14 in a deployed state and being attached to a second CubeSat 18 and a third CubeSat 20. The third CubeSat 20 can include a lens 28 on its exposed surface.

It is to be noted that the terms "front," "back," "top," "bottom," "over," "on," "under," and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Furthermore, those skilled in the art will recognize that boundaries between the above described units/operations are merely illustrative. The multiple units/operations may be combined into a single unit/operation, a single unit/operation may be distributed in additional units/operations, and units/operations may be operated at least partially overlapping in time. Moreover, alternative embodiments may include multiple instances of a particular unit/operation, and the order of operations may be altered in various other embodiments.

In the claims, the word 'comprising' or 'having' does not exclude the presence of other elements or steps than those listed in a claims. The terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The present disclosure can be embodied in various ways. The above described orders of the steps for the methods are only intended to be illustrative, and the steps of the methods of the present disclosure are not limited to the above specifically described orders unless otherwise specifically stated. Note that the embodiments of the present disclosure can be freely combined with each other without departing from the spirit and scope of the disclosure.

Although some specific embodiments of the present disclosure have been demonstrated in detail with examples, it should be understood by a person skilled in the art that the above examples are only intended to be illustrative but not to limit the scope of the present disclosure. The above embodiments can be modified without departing from the scope and spirit of the present disclosure which are to be defined by the attached claims. Accordingly, other implementations are within the scope of the claims.

What is claimed is:

1. A method of deploying an extensible boom from a housing that is part of a space vehicle, the method comprising:
   supporting first and second flexible rectangular sheets under compression in a stowed configuration on a same spool in the housing, each of the sheets supporting thereon a respective array of transducer devices, wherein each particular one of the first and second sheets has a respective surface that faces backside surfaces of all the transducer devices supported by the particular one of the sheets, the surface of each of the particular one of the sheets having an area that is greater than a combined area of the backside surfaces of all the transducer devices supported by the particular one of the sheets, and the housing having a rectangular parallel-piped shape, wherein in the stowed configuration each of the first and second sheets is circumferentially wound about the same spool; and
   releasing the first and second sheets from the stowed configuration by releasing the spool to allow the spool to rotate during a deployment operation so that each of the first and second sheets automatically deploys from the spool and unwinds into a curvilinear sheet having a uniform radius of curvature along a major axis of the sheet and extending substantially linearly away from the housing;
   wherein the first and second sheets are deployed simultaneously so that the first sheet is deployed in a first direction from the housing and the second sheet is deployed in an opposite direction from the housing such that angular momentum imparted by deploying the first sheet is canceled by angular momentum imparted by deploying the second sheet and vice-versa, thereby stabilizing the space vehicle by applying equal and opposite forces to the space vehicle.

2. The method of claim 1 wherein net momentum imparted to the space vehicle by deploying the first and second sheets is substantially zero.

3. The method of claim 1 wherein the first and second sheets are deployed without causing the satellite to move out of orbit.

4. The method of claim 1 wherein the housing includes apertures through which the first and second sheets are deployed, respectively.

5. The method of claim 4 wherein the apertures are located on opposite sides of the housing, wherein the first and second sheets are deployed simultaneously so that the first sheet is deployed through a first one of the apertures in the first direction from the housing and the second sheet is deployed through a second one of the apertures in an opposite direction from the housing, wherein angular momentum imparted by deploying the first sheet is canceled by angular momentum imparted by deploying the second sheet.

6. The method of claim 1 wherein each of the arrays of transducer devices comprises at least one of: (i) an array of photovoltaic devices; (ii) an array of semiconductor sensors; (iii) an antenna array; or (iv) thermal transfer elements.

7. The method of claim 6 wherein each of the arrays of transducers is mounted on a respective polyimide carrier that is bonded, respectively, to the first or second sheet.

8. The method of claim 7 wherein the array of transducer devices comprises an array of coverglass-interconnected solar cells mounted on the polyimide carrier by a pressure sensitive adhesive.

9. The method of claim 7 wherein each of the first and second sheets is composed of a composite laminate having a predetermined pattern of graphite fiber plies that impart a predefined tension in a planar surface of the sheet.

10. The method of claim 9 wherein the pattern of graphite fiber plies is pre-impregnated with resin and consists of at least intermediate modulus graphite fiber reinforced plies to impart substantially uniform strength, stiffness, and flexibility.

11. The method of claim 1 wherein each of the first and second sheets forms into a planar cylindrical portion sheet having a uniform cross-sectional curvature as the sheet unwinds from the spool configuration upon deployment to a deployed configuration.

12. The method of claim 1 wherein the housing is a one unit CubeSat housing.

13. The method of claim 1 wherein the housing is disposed in a spacecraft, and the spacecraft is composed of CubeSat modules, wherein the first and second sheets are stowed within a one unit CubeSat housing.

14. The method of claim 1 wherein the housing has a cubic shape.

15. The method of claim 1 wherein the backside surface of each of the transducer devices supported by the first sheet is mounted to a polyimide carrier bonded to the first sheet, and wherein the backside surface of each of the transducer devices supported by the second sheet is mounted to a polyimide carrier bonded to the second sheet.

* * * * *